United States Patent
De et al.

(10) Patent No.: US 12,155,741 B2
(45) Date of Patent: Nov. 26, 2024

(54) MULTIVARIATE DATA COMPRESSION SYSTEM AND METHOD THEREOF

(71) Applicant: INDIAN INSTITUTE OF TECHNOLOGY DELHI, New Delhi (IN)

(72) Inventors: Swades De, New Delhi (IN); Mayukh Roy Chowdhury, New Delhi (IN); Sharda Tripathi, New Delhi (IN)

(73) Assignee: INDIAN INSTITUTE OF TECHNOLOGY DELHI, New Delhi (IN)

( * ) Notice: Subject to any disclaimer, the term of this patent is extended or adjusted under 35 U.S.C. 154(b) by 577 days.

(21) Appl. No.: 17/290,937

(22) PCT Filed: Nov. 2, 2019

(86) PCT No.: PCT/IN2019/050812
§ 371 (c)(1),
(2) Date: May 3, 2021

(87) PCT Pub. No.: WO2020/089945
PCT Pub. Date: May 7, 2020

(65) Prior Publication Data
US 2021/0376853 A1    Dec. 2, 2021

(30) Foreign Application Priority Data
Nov. 2, 2018  (IN) .............................. 201811041561

(51) Int. Cl.
*H04L 69/28* (2022.01)
*G05B 23/02* (2006.01)
(Continued)

(52) U.S. Cl.
CPC ............ *H04L 69/28* (2013.01); *G05B 23/024* (2013.01); *G06F 18/2135* (2023.01);
(Continued)

(58) Field of Classification Search
CPC ..... G01R 25/00; G01R 21/00; H04L 41/0803; H04L 41/12; H04L 43/0876; H04L 67/51;
(Continued)

(56) References Cited

U.S. PATENT DOCUMENTS

2014/0214729 A1*  7/2014  Lin ......................... H04L 69/04
                                                      705/412
2015/0256435 A1*  9/2015  Sum ....................... H04L 69/28
                                                      702/62
(Continued)

FOREIGN PATENT DOCUMENTS

CN   104731875    6/2015
WO   2014/051712  4/2014

OTHER PUBLICATIONS

International Search Report issued Feb. 18, 2020, pertaining to PCT/IN2019/050812, filed Nov. 2, 2019, 3 pages.
(Continued)

*Primary Examiner* — Kyung H Shin
(74) *Attorney, Agent, or Firm* — Dinsmore & Shohl LLC

(57) ABSTRACT

A smart sensing architecture (100) includes smart meters (102) and processing units (104). The smart meters (102) generate and transmit multidimensional data streams to the processing units (104). A processing unit (104) determines an optimum batch size for a multidimensional data stream and generates a multidimensional batch of data. The processing unit (104) reduces dimensionality of the multidimensional batch of data using principal component analysis to generate a low-dimensional batch of data and performs compressive sampling on the low-dimensional batch of data to generate a compressed batch of data, thereby saving bandwidth of transmission.

6 Claims, 10 Drawing Sheets

(51) Int. Cl.
*G06F 18/2135* (2023.01)
*G06F 30/20* (2020.01)
*H03M 7/30* (2006.01)
*H03M 13/00* (2006.01)

(52) U.S. Cl.
CPC .......... *G06F 30/20* (2020.01); *H03M 7/6041* (2013.01); *H03M 7/6088* (2013.01); *H03M 13/6588* (2013.01)

(58) Field of Classification Search
CPC ... H04L 43/0888; H04L 67/125; H04L 69/28; H04L 41/0896; H04L 69/04; H02J 13/00034; H02J 13/00017; H02J 13/00022; H02J 3/00; H02J 13/00024; G06F 30/20; G06F 18/256; G06F 18/24323; G06F 18/2135; G06F 18/23213; G06F 30/00; G06F 17/16; G06F 18/2321; G06Q 10/04; G06Q 50/06; G06Q 10/06; G05B 19/0426; G05B 17/02; G06N 20/10; G06N 7/01; H03M 13/6588; H03M 13/6312; H03M 7/3062; E02F 9/264; E02F 3/422; E02F 3/3405; E02F 9/26
See application file for complete search history.

(56) References Cited

U.S. PATENT DOCUMENTS

| | | | |
|---|---|---|---|
| 2016/0012088 A1 | 1/2016 | Rossi et al. | |
| 2018/0183460 A1* | 6/2018 | Lee | H03M 13/6588 |
| 2020/0265119 A1* | 8/2020 | Desai | G06F 18/2135 |
| 2021/0034712 A1* | 2/2021 | Dasgupta | G06F 30/20 |

OTHER PUBLICATIONS

Written Opinion issued Feb. 18, 2020, pertaining to PCT/IN2019/050812, filed Nov. 2, 2019, 6 pages.
Tcheou, et al., "The compression of electric signal waveforms for smart grids:State of the art and future trends," IEEE Trans. Smart Grid, vol. 5, No. 1, pp. 291-302, Jan. 2014.
Eichinger et al., "A time-series compression technique and its application to the smart grid," The VLDB Journal, vol. 24, No. 2, pp. 193-218, 2015.
Ringwelski, et al., "The hitchhiker's guide to choosing the compression algorithm for your smart meter data," in Proc. IEEE Int. Energy Conf. Exhibit. (ENERGYCON), Florence, Italy, Sep. 2012, pp. 935-940.
Zeinali, et al., "Impact of compression and aggregation in wireless networks on smart meter data," in Proc. IEEE Wksp on Sig. Process. Advances in Wireless Commun. (SPAWC), Edinburgh, UK, Jul. 2016, pp. 1-5.
Unterweger, et al., "Resumable load data compression in smart grids," IEEE Trans. Smart Grid, vol. 6, No. 2, pp. 919-929, Mar. 2015.
Unterweger, et al., "The effect of data granularity on load data compression," in Proc. DA-CH Conf. Energy Informat. New York, USA, Jan. 2015, pp. 69-80.
Wang, et al., "A randomized response model for privacy preserving smart metering," IEEE Trans. Smart Grid, vol. 3, No. 3, pp. 1317-1324, Sep. 2012.
Tong, et al., "Smart metering load data compression based on load feature identification," IEEE Trans. Smart Grid, vol. 7, No. 5, pp. 2414-2422, Sep. 2016.
Abuadbba, et al., "Gaussian approximation based lossless compression of smart meter readings," IEEE Trans. Smart Grid, vol. PP, No. 99, pp. 1-1, 2018(early access).
Tripathi, et al., "An Efficient Data Characterization and Reduction Scheme for Smart Metering Infrastructure," IEEE Trans. Ind. Informat., vol. PP , No. 99, pp. 1-1, 2018(early access).
Wang, et al., "Sparse and redundant representation based smart meter data compression and pattern extraction," IEEE Trans. Power Syst., vol. 32, No. 3, pp. 2142-2151, May 2017.
De Souza, et al., "Data compression in smart distribution systems via singular value decomposition," IEEE Trans. Smart Grid, vol. 8, No. 1, pp. 275-284, Jan. 2017.
Das, et al., "Principal component analysis based compression scheme for power system steady state operational data," in Proc. IEEE PES Innov. Smart Grid Technol.—India, 2011, pp. 95-100.
Mehra, et al., "Analysis of PCA based compression and denoising of smart grid data under normal and fault conditions," in Proc. IEEE Int. Conf. Electronics, Computing and Communication Technologies (CONECCT), pp. 1-6, 2013.
Dai, et al., "Subspace pursuit for compressive sensing signal reconstruction," IEEE Trans. Info. Theory, vol. 55, No. 5, pp. 2230-2249, 2009.
Batra, et al., "It's Different: Insights into Home Energy Consumption in India," in Proc. ACM Wksp Embedded Systems For Energy-Efficient Buildings (BuildSys), Roma, Italy, Nov. 2013, pp. 3:1-3:8.
Qin, et al., "Numerical simulation and experiment on optical packet header recognition utilizing reservoir computing based on optoelectronic feedback," IEEE Photon. J., vol. 9, No. 1, pp. 1-11, Feb. 2017.

* cited by examiner

MULTIVARIATE DATA COMPRESSION SYSTEM AND METHOD THEREOF

FIELD OF INVENTION

The present invention generally relates to electronic data processing, and particularly but not exclusively, relates to data compression.

BACKGROUND

Wireless sensor networks (WSN) form an important and huge part of Internet of Things (IoT). The sensors generate huge volume of data, also known as big data. The big data has always been an area of concern both due to the amount of resources required for transmission of the big data over the network to a distant cloud as well as to store the big data at the cloud.

One of the areas of IoT networks is Automated Metering Infrastructure (AMI) in smart grid networks. AMI includes many smart meters installed in domestic or industrial environments for fine-granular monitoring of power consumption pattern. Data collected by the smart meters is interfaced with various other applications, such as, billing, demand side management, load forecasting, dynamic pricing, etc., to improve services delivered to customers as well as energy providers. Usually, the smart meters sample data at high rate and report to the collecting nodes, which is usually a cloud server. Due to high volume of collected data, bandwidth requirement for the data transmission and the storage space requirement for data archival is very high.

Conventional smart meter data compression techniques can be broadly categorized based upon different factors such as: (a) class of data they are operating on-granular [1]-[6] or aggregate level [7], [8] in the AMI framework, (b) whether the compression is lossless [3], [9] or it induces some loss of information [10], (c) whether it is effective for high resolution data [1]-[6] or only works for low resolution samples, (d) whether it is used for temporal [10], [11] or spatial [12], [13], or spatio-temporal [14] compression of the same data variable.

[1] M. P. Tcheou, L. Lovisolo, M. V. Ribeiro, E. A. B. da Silva, M. A. M. Rodrigues, J. M. T. Romano, and P. S. R. Diniz, "The compression of electric signal waveforms for smart grids: State of the art and future trends," IEEE Trans. Smart Grid, vol. 5, no. 1, pp. 291-302, January 2014.

[2] F. Eichinger, P. Efros, S. Karnouskos, and K. Bohm, "A time-series compression technique and its application to the smart grid," The VLDB Journal, vol. 24, no. 2, pp. 193-218, 2015

[3] M. Ringwelski, C. Renner, A. Reinhardt, A. Weigel, and V. Turau, "The hitchhiker's guide to choosing the compression algorithm for your smart meter data," in Proc. IEEE Int. Energy Conf. Exhibit. (ENERGYCON), Florence, Italy, September 2012, pp. 935-940

[4] M. Zeinali and J. S. Thompson, "Impact of compression and aggregation in wireless networks on smart meter data," in Proc. IEEE Wksp on Sig. Process. Advances in Wireless Commun. (SPAWC), Edinburgh, UK, July 2016, pp. 1-5.

[5] A. Unterweger and D. Engel, "Resumable load data compression in smart grids," IEEE Trans. Smart Grid, vol. 6, no. 2, pp. 919-929, March 2015.

[6] A. Unterweger, D. Engel, and M. Ringwelski, "The effect of data granularity on load data compression," in Proc. DA-CH Conf. Energy Informat. New York, USA, January 2015, pp. 69-80.

[7] S. Wang, L. Cui, J. Que, D. H. Choi, X. Jiang, S. Cheng, and L. Xie, "A randomized response model for privacy preserving smart metering," IEEE Trans. Smart Grid, vol. 3, no. 3, pp. 1317-1324, September 2012.

[8] X. Tong, C. Kang, and Q. Xia, "Smart metering load data compression based on load feature identification," IEEE Trans. Smart Grid, vol. 7, no. 5, pp. 2414-2422, September 2016.

[9] A. Abuadbba, I. Khalil, and X. Yu, "Gaussian approximation based lossless compression of smart meter readings," IEEE Trans. Smart Grid, vol. PP, no. 99, pp. 1-1, 2018 (early access).

[10] S. Tripathi and S. De, "An Efficient Data Characterization and Reduction Scheme for Smart Metering Infrastructure," IEEE Trans. Ind. Informat., vol. PP, no. 99, pp. 1-1, 2018 (early access).

[11] Y. Wang, Q. Chen, C. Kang, Q. Xia, and M. Luo, "Sparse and redundant representation based smart meter data compression and pattern extraction," IEEE Trans. Power Syst., vol. 32, no. 3, pp. 2142-2151, May 2017.

[12] J. C. S. de Souza, T. M. L. Assis, and B. C. Pal, "Data compression in smart distribution systems via singular value decomposition," IEEE Trans. Smart Grid, vol. 8, no. 1, pp. 275-284, January 2017.

[13] S. Das, P. S. N. Rao, "Principal component analysis based compression scheme for power system steady state operational data," in Proc. IEEE PES Innov. Smart Grid Technol.—India, 2011, pp. 95-100.

[14] R. Mehra, N. Bhatt, F. Kazi, N. M. Singh, "Analysis of PCA based compression and denoising of smart grid data under normal and fault conditions," in Proc. IEEE Int. Conf. Electronics, Computing and Communication Technologies (CONECCT), pp. 1-6, 2013.

It is observed that the existing smart meter data compression techniques consider compression of individual/single variable only. But in real smart meters, multiple variables like power, current, voltage, frequency, energy, meter-health related parameters are sensed and also transmitted over the communication link to the data aggregator. Since the amount of data generated every day by the numerous smart meters installed throughout the world is massive; while the spectrum is an expensive resource, it is essential to investigate whether continuous transmission of all the measured variables is required or not. Some of them are expected to be correlated with each other and hence continuous transmission of all of them may lead to redundancy in information.

There is no existing work that exploits the inter-relation among different variable streams of smart meter to perform multivariate data compression.

Therefore, there is a need of multivariate data compression technique that compresses data and saves bandwidth of transmission by jointly accounting inter-dependency among different data streams as well as temporal correlation within each stream.

SUMMARY

This summary is provided to introduce concepts related to a smart sensing architecture and a method of compressing data thereof. This summary is neither intended to identify essential features of the present disclosure nor is it intended for use in determining or limiting the scope of the present disclosure.

In an embodiment of the present invention, a method of compressing data is provided. The method includes receiving a plurality of multidimensional data streams from a plurality of sources and determining an optimum batch size for the multidimensional data streams. A multidimensional batch of data is generated based on aforesaid batch size. The dimensionality of the multidimensional batch of data is reduced using principal component analysis to generate a low-dimensional batch of data. The method further includes performing temporal compression on the low dimensional batch of data to generate a compressed batch of data.

In another embodiment of the present invention, a smart sensing architecture is provided. The smart sensing architecture includes a plurality of smart sensing devices and a processing unit. The smart sensing devices generate and transmit a plurality of multidimensional data streams. The processing unit is connected to the smart sensing devices. The processing unit receives the plurality of multidimensional data streams and determines an optimum batch size for the multidimensional data streams. The processing unit then generates a multidimensional batch of data based on aforesaid batch size and reduces dimensionality of the multidimensional batch of data using principal component analysis to generate a low-dimensional batch of data. Thereafter, the processing unit performs temporal compression on the low dimensional batch of data to generate a compressed batch of data.

In an exemplary embodiment, the processing unit identifies the principal components in the multidimensional batch of data, determines a first set of principal components comprising more variance than a predefined threshold variance, and generates the low-dimensional batch of data including the first set of principal components.

In another exemplary embodiment, the optimum batch size is determined such that a normalized root mean square error (nRMSE) of output data reconstructed based on the compressed batch of data is less than a predefined error limit.

In yet another exemplary embodiment, the optimum batch size is determined based on a sparsity of the multidimensional data streams.

BRIEF DESCRIPTION OF ACCOMPANYING DRAWINGS

The detailed description is described with reference to the accompanying figures. In the figures, the left-most digit(s) of a reference number identifies the figure in which the reference number first appears. The same numbers are used throughout the drawings to reference like features and modules.

Figure 1:
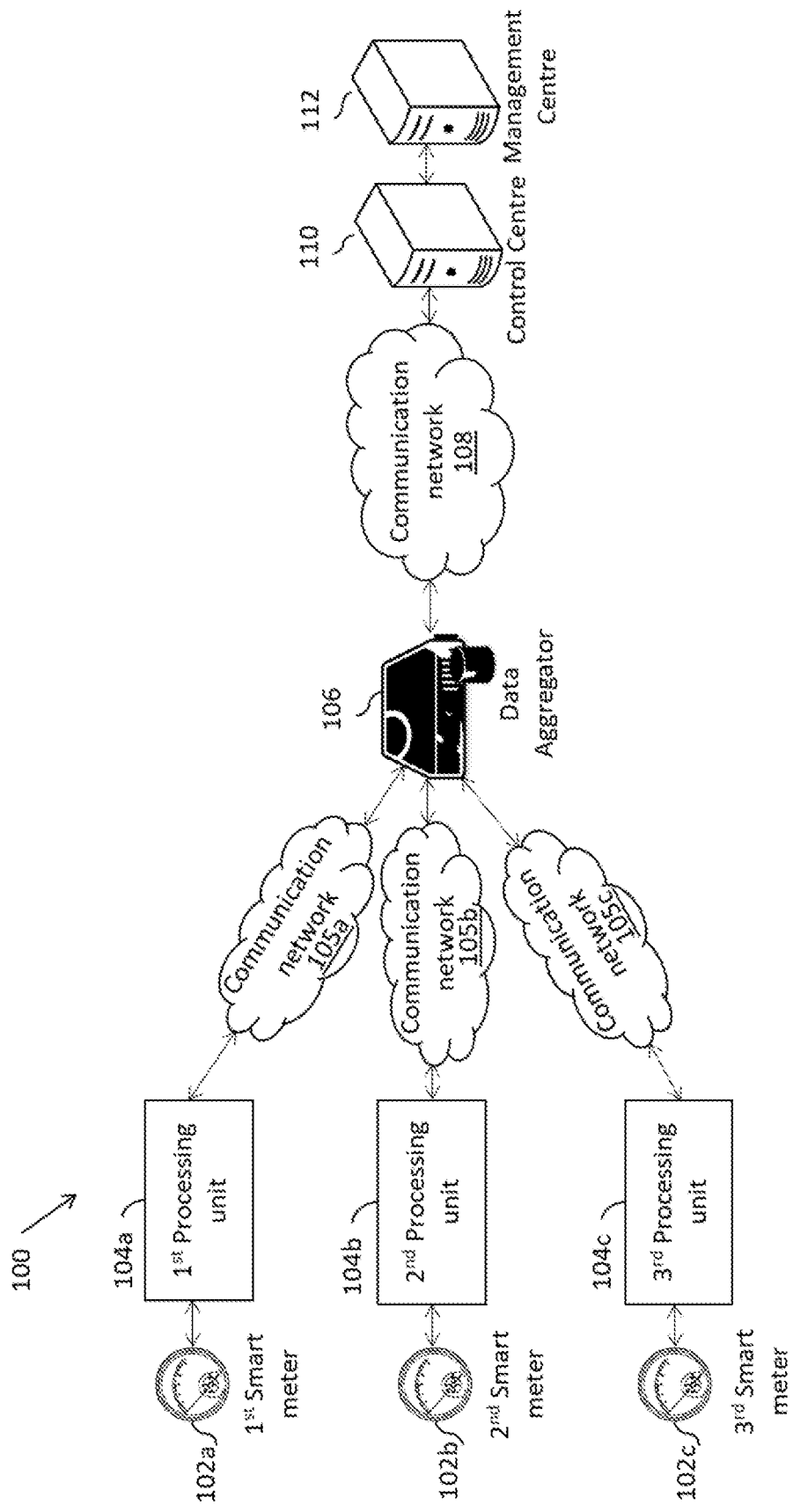
FIG. 1 illustrates a smart sensing architecture in accordance with an embodiment of the present invention.

It should be appreciated by those skilled in the art that any block diagrams herein represent conceptual views of illustrative systems embodying the principles of the present disclosure. Similarly, it will be appreciated that any flow charts, flow diagrams, and the like represent various processes which may be substantially represented in computer readable medium and so executed by a computer or processor, whether or not such computer or processor is explicitly shown.

DETAILED DESCRIPTION

The various embodiments of the present disclosure provide a smart sensing architecture and a method of compressing data in the smart sensing architecture.

In the following description, for purpose of explanation, specific details are set forth in order to provide an understanding of the present disclosure. It will be apparent, however, to one skilled in the art that the present disclosure may be practiced without these details. One skilled in the art will recognize that embodiments of the present disclosure, some of which are described below, may be incorporated into a number of systems.

However, the systems and methods are not limited to the specific embodiments described herein. Further, structures and devices shown in the figures are illustrative of exemplary embodiments of the present disclosure and are meant to avoid obscuring of the present disclosure.

Furthermore, connections between components and/or modules within the figures are not intended to be limited to direct connections. Rather, these components and modules may be modified, re-formatted or otherwise changed by intermediary components and modules.

References in the present disclosure to "one embodiment" or "an embodiment" mean that a particular feature, structure, characteristic, or function described in connection with the embodiment is included in at least one embodiment of the invention. The appearances of the phrase "in one embodiment" in various places in the specification are not necessarily all referring to the same embodiment.

The present disclosure directed towards a smart sensing architecture and a method of compressing data in the smart sensing architecture.

In an embodiment of the present invention, a method of compressing data is provided. The method includes receiving a plurality of multidimensional data streams from a plurality of sources and determining an optimum batch size for the multidimensional data streams. A multidimensional batch of data is generated based on aforesaid batch size. A dimensionality of the multidimensional batch of data is reduced using principal component analysis to generate a low-dimensional batch of data. The method further includes performing temporal compression on the low dimensional batch of data to generate a compressed batch of data.

In another embodiment of the present invention, a smart sensing architecture is provided. The smart sensing architecture includes a plurality of smart sensing devices and a processing unit. The smart sensing devices generate and transmit a plurality of multidimensional data streams. The processing unit is connected to the smart sensing devices. The processing unit receives the plurality of multidimensional data streams and determines an optimum batch size for the multidimensional data streams. The processing unit then generates a multidimensional batch of data based on aforesaid batch size and reduces dimensionality of the multidimensional batch of data using principal component analysis to generate a low-dimensional batch of data. Thereafter, the processing unit performs temporal compression on the low dimensional batch of data to generate a compressed batch of data.

In yet another embodiment, an Adaptive Multivariate Data Compression (AMDC) algorithm is provided.

In an exemplary embodiment, the processing unit identifies the principal components in the multidimensional batch of data, determines a first set of principal components comprising more variance than a predefined threshold variance, and generates the low-dimensional batch of data including the first set of principal components.

In another exemplary embodiment, the optimum batch size is determined such that a normalized root mean square error (nRMSE) of output data reconstructed based on the compressed batch of data is less than a predefined error limit.

In yet another exemplary embodiment, the optimum batch size is determined based on a sparsity of the multidimensional data streams.

FIG. 1 illustrates a smart sensing architecture (100) in accordance with an embodiment of the present invention. The smart sensing architecture (100) includes a plurality of smart sensing devices (102) including first through third smart sensing devices (102a-102c). In an example, the smart sensing devices (102) are smart meters (102) including first through third smart meters (102a-102c). Each smart meter (102) is connected to corresponding processing unit (104), namely, first through third processing units (104a-104c). The processing units (104) are connected to a data aggregator (106). The data aggregator (106) is connected to a communication network (108). The communication network (108) connects the data aggregator (106) to a control center (110) and a management center (112).

The smart meters (102) are installed at customer premises, such as, but not limited to, houses, buildings, factories, malls, hospitals, schools, colleges, hostels, hotels, and other places. The smart meters (102) are electricity meters that monitor electricity usage and are equipped with antennas and other communication circuitry to transmit data indicative of the monitored electricity usage. The smart meters (102) sample physical parameters, such as, but not limited to, current, voltage, and frequency at a predetermined sampling rate. Typically, the sampling rate varies from 1 sample per second to 1 sample per few minutes.

The smart meters (102) collect the data samples periodically and transmit the collected data samples to the processing units (104) periodically. The data samples may represent measured parameters, such as, but not limited to, a voltage value (V), a current value (A), a frequency (Hz), or a power value (W) measured by the smart meters (102). The measured parameters directly or indirectly indicate the amount of electricity consumed at customer premises corresponding to the smart meters (102).

The method of compressing data of the present invention does not require any modification in the functionality of the smart meters. Therefore, it may be understood to a person of ordinary skill in the art that the processing units of the present invention may be utilized with existing smart meters, and hence, the processing units of the present invention are fully compatible with existing smart meters.

The first through third processing units (104a-104c) are connected to the first through third smart meters (102a-102c) respectively. The processing units (104) receive the data samples from the smart meters (102). Thereafter, the processing units (104) compress the data samples and transmit the compressed data samples to the data aggregator (106) by way of wired or wireless communication channels (105).

The data aggregator (106) is connected to the first through third processing units (104a-104c) by way of first through third communication networks (105a-105b). Examples of the first through third communication networks (105a-105b) include wired or wireless communication networks.

The data aggregator (106) aggregates the compressed data to generate an aggregated data stream. Thereafter, the data aggregator (106) transmits the aggregated data stream to the control center (110) by way of the communication network (108). The communication network (108) may be wired or wireless communication network.

The control center (110) extracts the compressed data from the aggregated data stream. The control center (110) further decompresses the extracted data to regenerate the data samples corresponding to the first through third smart meters (102a-102c). The process of regeneration results into regenerated samples of high accuracy, such that the loss of information is minimum and can be ignored for practical applications.

The control center (110) transmits the data samples to the management center (112). The management center (112) processes the data samples to display the measured data in a high-level computer application to a user. In that, the management center (112) may display statistics such as, but not limited to, duration of electricity consumption, amount of electricity consumption, etc. of each of the first through third smart meters (104a-104c) in form of reports, graphs, charts, tables, etc.

In an embodiment of the present invention, the smart meters (102) transmit data samples to the processing units (104) in form of data streams. The data streams are multidimensional data streams. The data streams include multiple variables. The processing units (104) receive the data streams from the smart meters (102). The processing units (104) determine an optimum batch size for the data streams and generate multiple multidimensional batches of data by sampling the data streams. The processing units (104) then reduces the dimensionality of the data streams by using Principal Component Analysis (PCA) to generate a low-dimensional batch of data. Thereafter, the processing unit (104) performs Compressive Sensing (CS), i.e., temporal compression on the low-dimensional batch of data to generate a compressed batch of data.

The processing units (104) applies PCA on the multidimensional batch of data and determines principal components by using eigen value-eigen vector combination from a correlation matrix of the multidimensional batch of data. Starting with the eigen vector corresponding to the highest eigen value, the processing unit (104) determines a number of principal components that are sufficient to reconstruct the original data at receiver side. In PCA projected space, only those principal components that retain most of the variance of the data are enough for proper reconstruction at the receiver are retained.

In an example, let X be the input data matrix, sized m×n, where n is the number of dimensions i.e. variables measured by the smart meter and m is the number of samples taken for each variable. PCA operation on X returns the orthogonal basis vectors in matrix V and principal components in matrix Y. If p<n number of principal components preserve more than certain threshold percentage of the total variance, only those p principal components and the corresponding coefficients are sufficient for proper reconstruction of X. Once the value of p satisfying the required variance criteria is chosen, $V_{red}$ which consists of only the first p columns of V is obtained. Further, the projection of input data X along those p orthonormal dimensions are computed as:

$$Y_{red} = XV_{red} \quad (1)$$

Further, temporal compression is performed on every column of $Y_{red}$. Since each column represents a smart meter variable data projected in different space, the columns may have different sparsity. To adapt to the temporal dynamics, sparsity of each data stream is computed at run time. After the compression by CS, the compressed data is sent over transmission channel to the receiver. At the receiver CS recovery is performed using Subspace Pursuit (SP) algorithm [15] followed by PCA reconstruction. The SP algorithm is preferred over existing other CS reconstruction algorithms because of decent reconstruction performance and fast computation.

[15] W. Dai and O. Milenkovic, "Subspace pursuit for compressive sensing signal reconstruction," *IEEE Trans. Info. Theory*, vol. 55, no. 5, pp. 2230-2249, 2009.

In an embodiment, error between the actual and the reconstructed data is measured in terms of normalized root mean squared error (nRMSE). The compression method of the present invention is adaptive in the sense that both sparsity in CS (which signifies number of transmitted samples) and number of principal components in PCA (which signifies number of transmitted variables) are computed in the run time. Hence both, sparsity in CS and number of principal components are decided based on the data in the particular batch.

Figure 2:
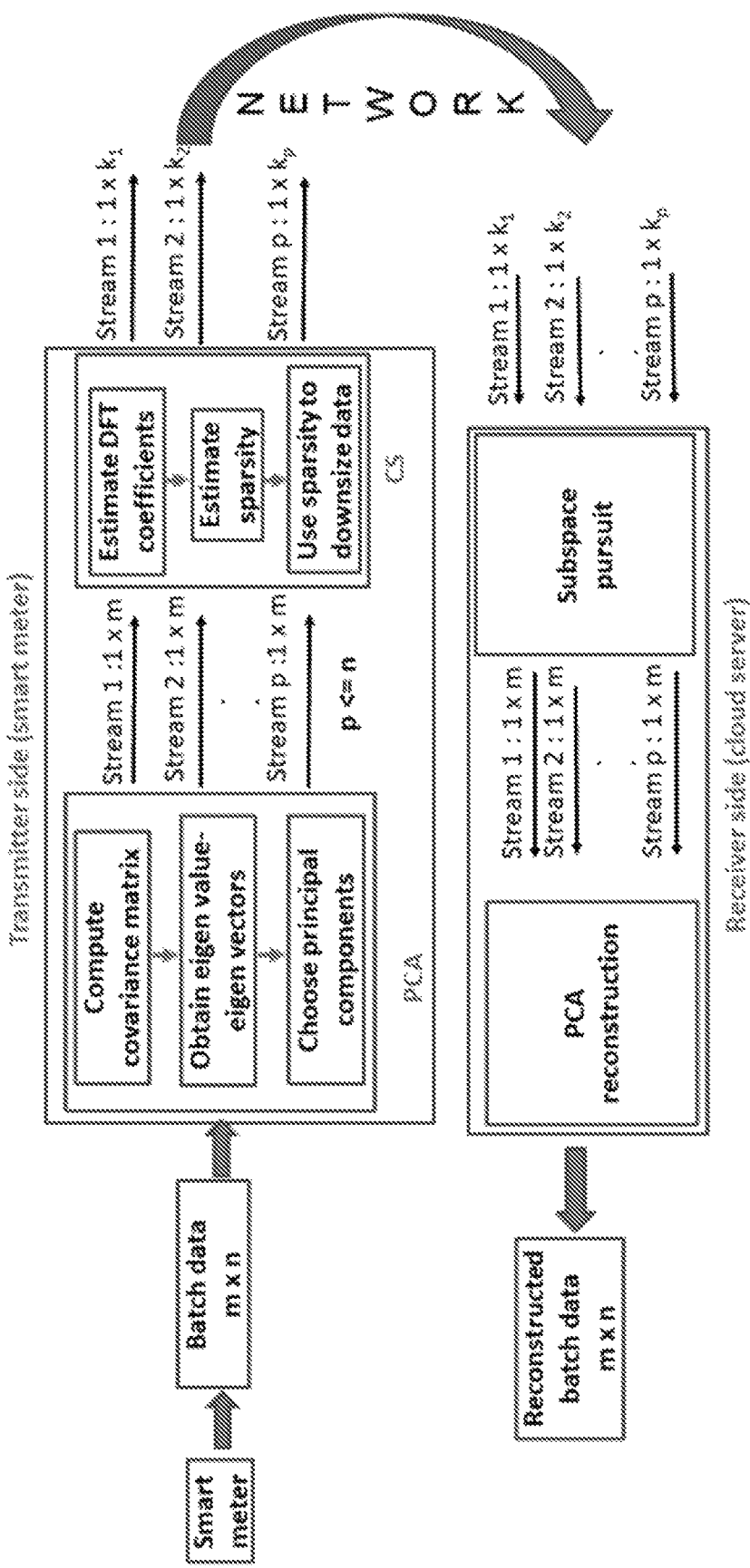
FIG. 2 illustrates a flow of a method of compressing data in accordance with an embodiment of the present invention.

FIG. 2 illustrates a flow of a method of compressing data in accordance with an embodiment of the present invention. The method is implemented on multidimensional data from four smart meters (IITD-01, IITD-02, IITD-03, and IITD-04) installed at different venues. Each of these venues has unique power signatures and the meters sample multiple streams at an interval of 30 seconds. To test the suitability of the proposed algorithm on finer granular data, it is also applied on an open dataset namely, Indian Dataset for Ambient Water and Energy (iAWE) [16], which is 1 second sampled record of domestic load of a household in New Delhi, India.

[16] N. Batra, M. Gulati, A. Singh, and M. B. Srivastava, "It's Different: Insights into Home Energy Consumption in India," in Proc. *ACM Wksp Embedded Systems For Energy-Efficient Buildings (BuildSys)*, Roma, Italy, November 2013, pp. 3:1-3:8. The venues are described as follows:

TABLE 1

Datasets used for performance evaluation

| Meter | Installation Site | Sampling Interval |
|---|---|---|
| IITD-01 | Networks Research Lab | 30 sec |
| IITD-02 | MSB Substation | 30 sec |
| IITD-03 | Boys' Hostel Kitchen | 30 sec |
| IITD-04 | Switch Room | 30 sec |
| iAWE | IIIT Delhi Household | 1 sec |

While implementing the present method on real smart meters, the optimum batch size selection for each data streams was performed separately. It was observed that for all the variables, as batch size increases from 2 to 200, the normalized root mean squared error (nRMSE) of reconstruction in case of CS is non-decreasing whereas the corresponding bandwidth saving decreases. Hence, in an exemplary embodiment, the batch size of CS was kept at the minimum possible value i.e. two.

Figure 3:
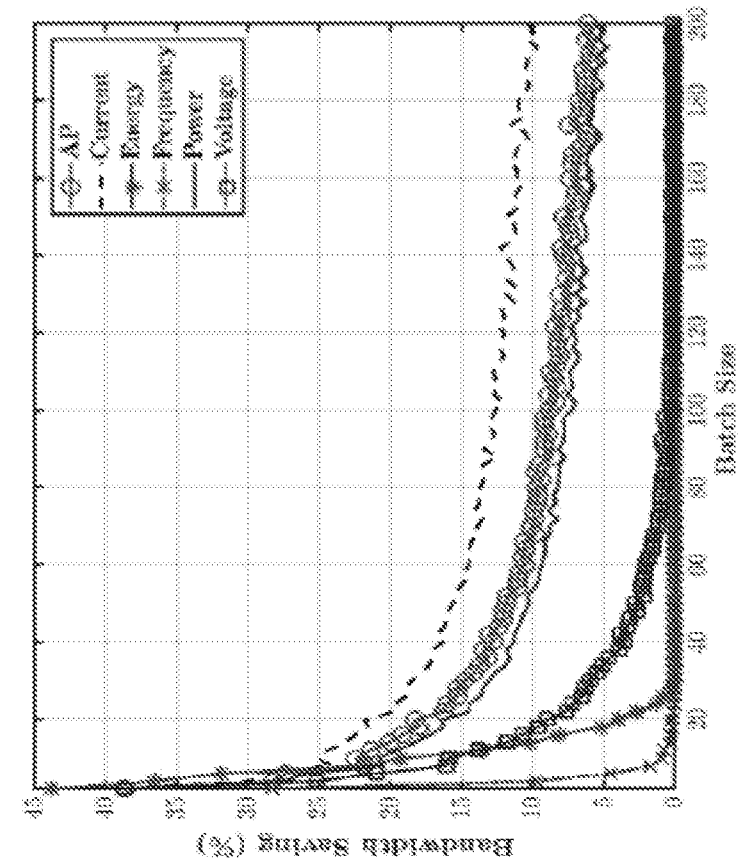
FIG. 3 illustrates variation of nRMSE and bandwidth saving with batch size for compressive sampling in accordance with an embodiment of the present invention.
Figure 3:
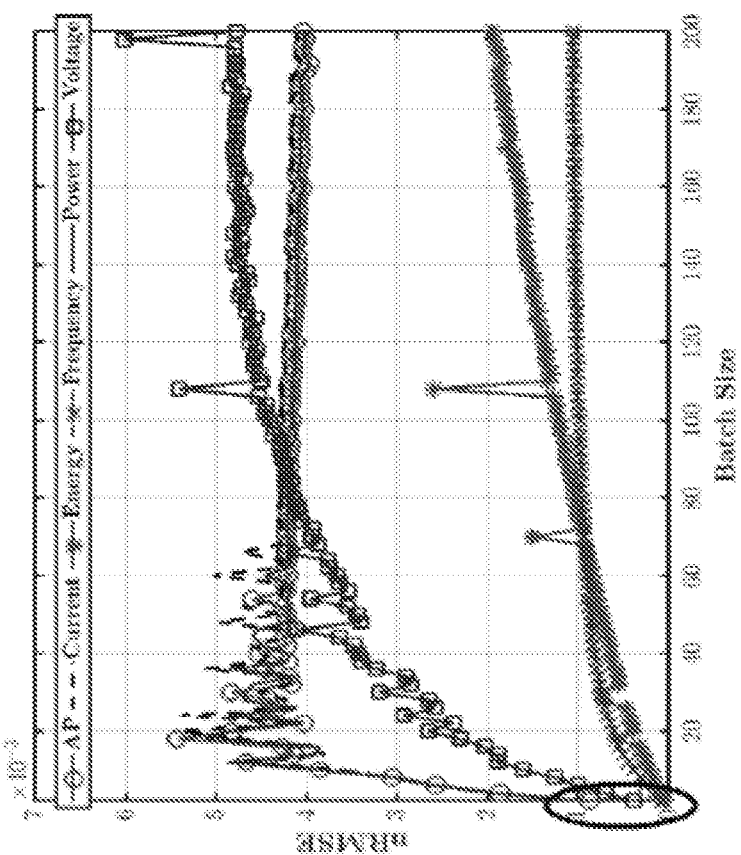

FIG. 3 illustrates variation of nRMSE and bandwidth saving with batch size for compressive sampling in accordance with an embodiment of the present invention. In FIG. 3, variation of nRMSE and bandwidth with increasing batch-size is shown for different variables for one of the meters (IITD-01). The same for the other meters has not been shown here as they exhibit similar trend.

Figure 4:
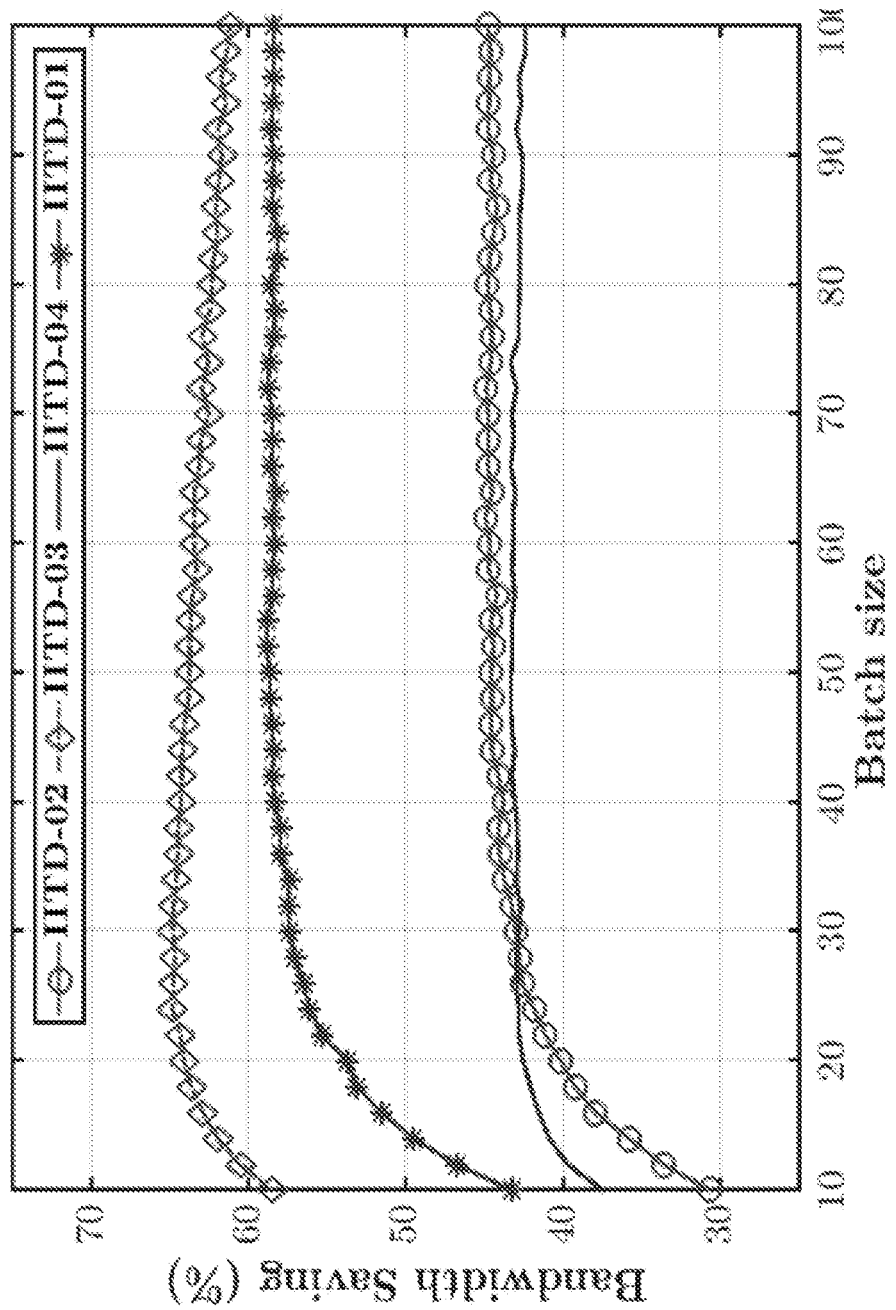
FIG. 4 illustrates variation of bandwidth saving with batch size for principal component analysis in accordance with an embodiment of the present invention.

FIG. 4 illustrates variation of bandwidth saving with batch size for principal component analysis in accordance with an embodiment of the present invention. In FIG. 4, variation of bandwidth saving with increasing batch size for PCA is shown. It was observed that for most of the meters with 30 seconds sampling interval, there is no significant variation in bandwidth saving beyond batch size of 30 samples. Also, it was found in the literature that, most of the smart meters in domestic or industrial setting report accumulated data once in every 15 minutes. In an example, to make the data collection at the cloud as real-time as possible, the batch size is kept at most 30 samples which accounts for 15 minutes' data for the meters sampling once in every 30 seconds. Similarly, for the 1 second dataset bandwidth saving saturation was observed at batch size of 250 samples which is close to 4 minutes' data. Hence, in an example, the optimum batch size $N_{opt}$ is chosen as 30 samples for the data sampled at (1/30) Hz frequency and 250 samples for the data sampled at 1 Hz. For faithful data reconstruction, the nRMSE induced at selected batch size should not cross allowable threshold. This error threshold varies with the kind of application interacting with the data. In this work, nRMSE of 0.2 is deemed to be to be acceptable [17].

[17] J. Qin, Q. Zhao, H. Yin, Y. Jin, and C. Liu, "Numerical simulation and experiment on optical packet header recognition utilizing reservoir computing based on optoelectronic feedback," *IEEE Photon. J.*, vol. 9, no. 1, pp. 1-11, February 2017.

Figure 5:
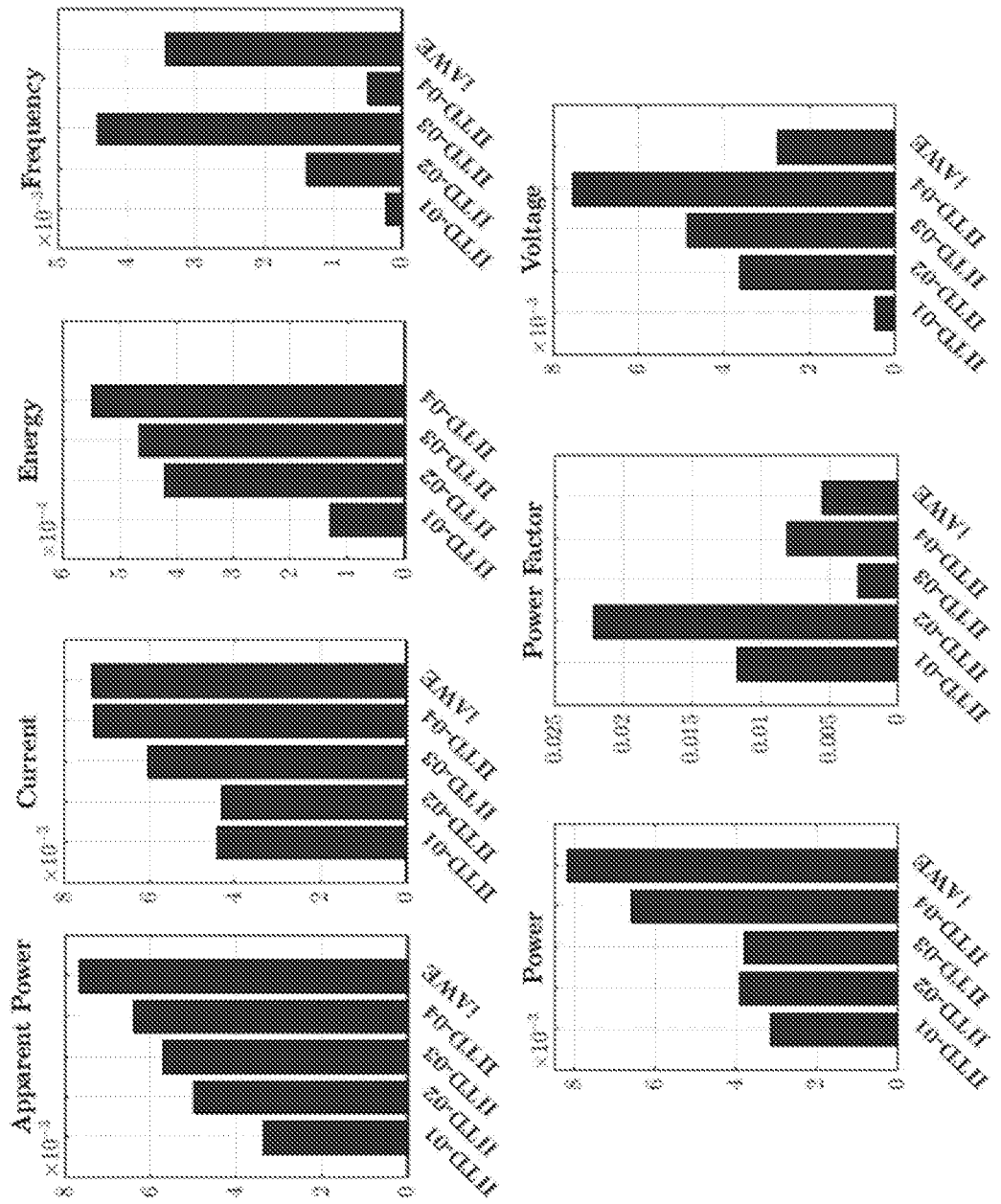
FIG. 5 illustrates reconstruction nRMSE of AMDC in accordance with an embodiment of the present invention.

FIG. 5 illustrates reconstruction nRMSE of AMDC in accordance with an embodiment of the present invention. In FIG. 5, nRMSE of reconstruction for all variables across all meters is shown. It was observed that for every case the nRMSE is below the acceptable threshold, in fact in the order of $10^{-3}$, which is much less than 0.2. In an example, bandwidth saving may be traded off with the corresponding nRMSE induced as per the requirement of the application and its error tolerance. After optimum batch size $N_{opt}$ is selected, data is captured in batches of $N_{opt}$ size and the compression algorithm is applied on them. After decompression at receiver side, all the streams are reconstructed.

Figure 6:
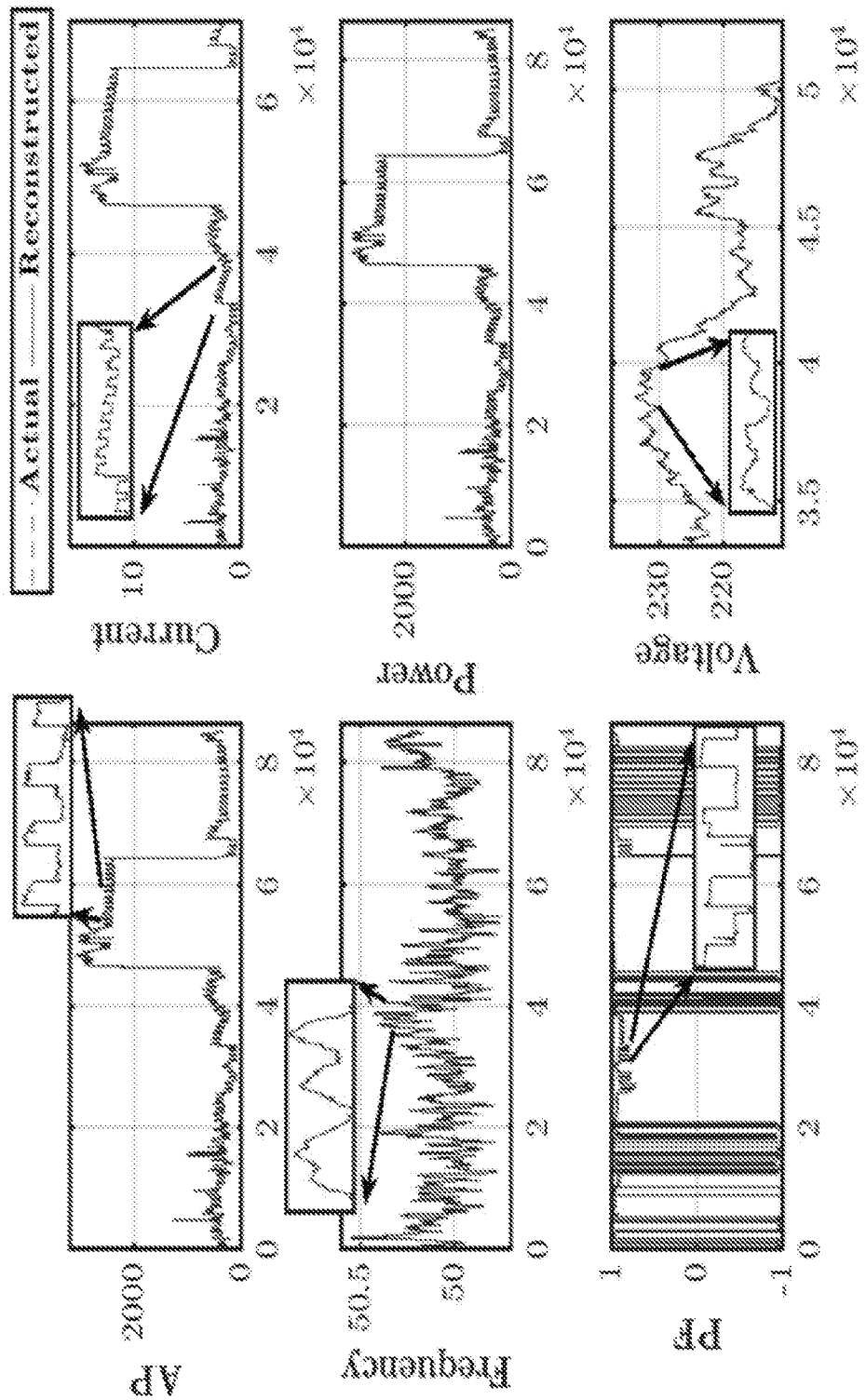
FIG. 6 illustrates reconstruction performance of 1 sec sampled data in accordance with an embodiment of the present invention.
Figure 7:
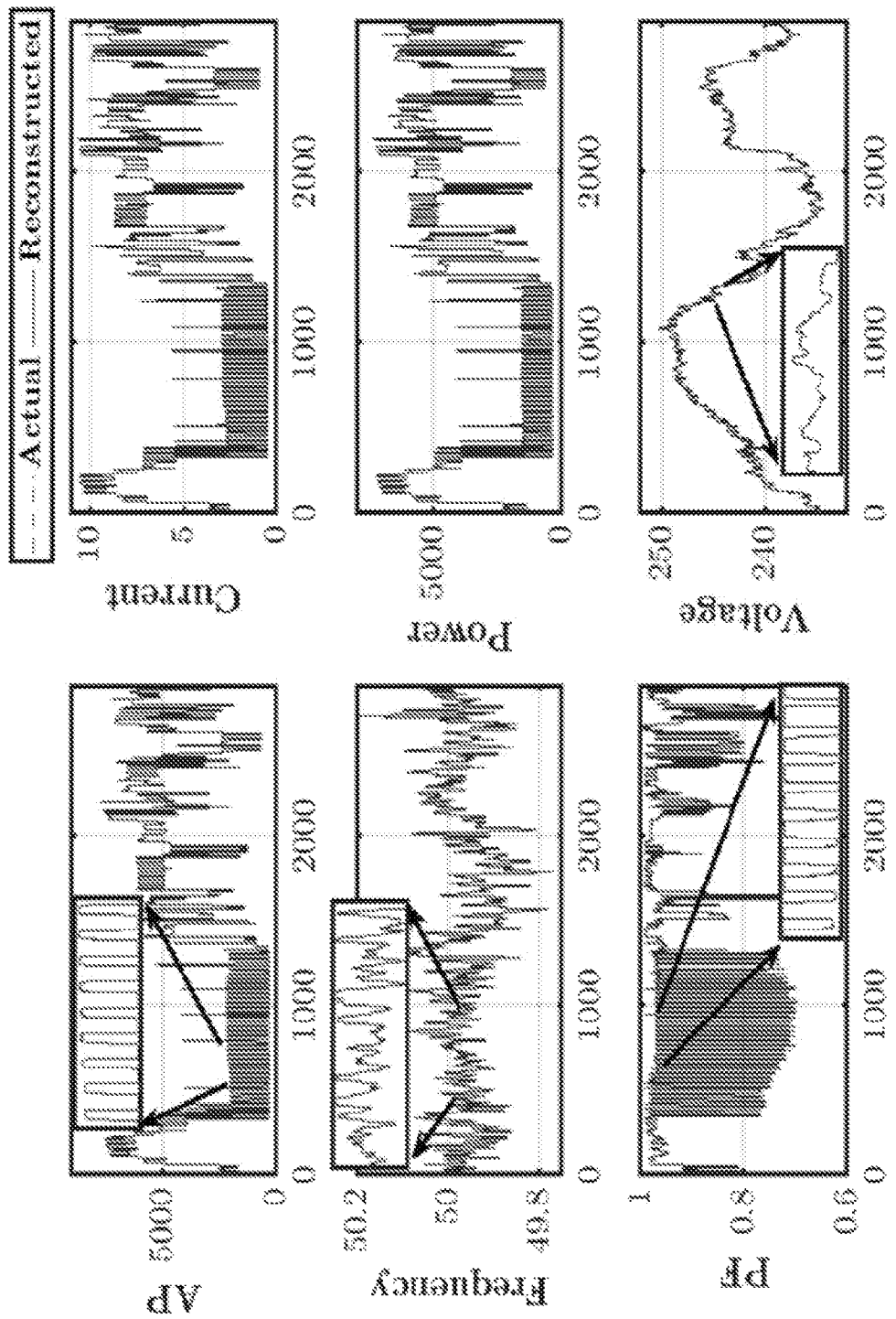
FIG. 7 illustrates reconstruction performance of 30 sec sampled data in accordance with an embodiment of the present invention.
Figure 8:
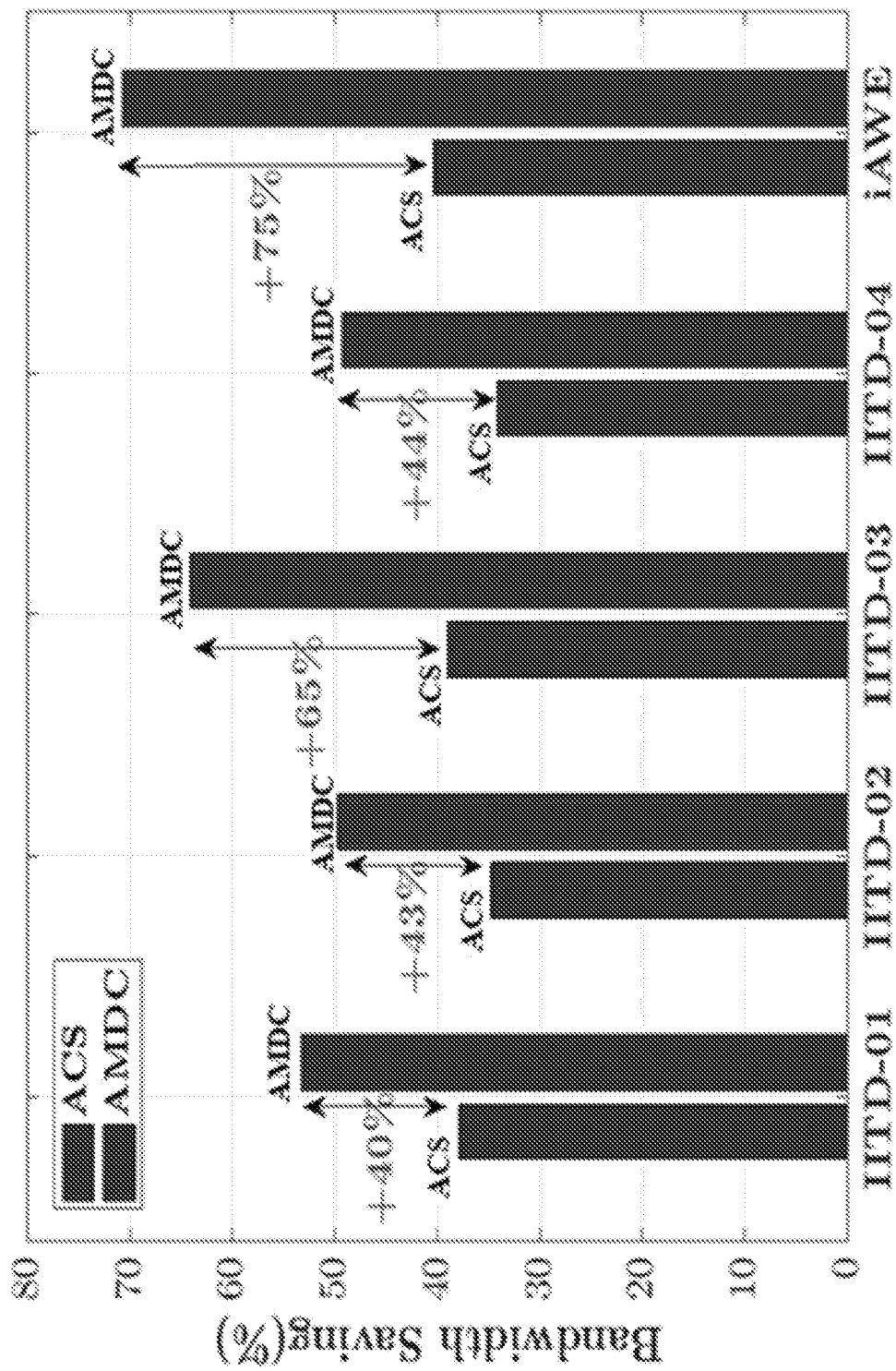
FIG. 8 illustrates bandwidth saving comparison with ACS in accordance with an embodiment of the present invention.

FIG. 6 illustrates reconstruction performance of 1 sec sampled data in accordance with an embodiment of the present invention. FIG. 7 illustrates reconstruction performance of 30 sec sampled data in accordance with an embodiment of the present invention. FIGS. 6 and 7 show the comparison of actual and reconstructed data for some of the variables of iAWE data (1 sec sampled) and IITD-03 meter (30 second sampled), respectively. It can be clearly seen that the reconstructed data is almost overlapping with the actual data in all the cases. To evaluate the performance of the proposed AMDC algorithm the bandwidth saving as well as the error induced due to compression was compared with that of ACS algorithm. In Table 2, nRMSE comparison for all data venues and variables is shown, while, FIG. 8 depicts the bandwidth saving comparison.

particular venue/meter. The per batch execution time is found to be on an average 0.11 second for a batch of 30 samples collected over 15 minutes. Hence, the time complexity of the algorithm is also minimal as its execution time is ignorable compared to the data collection window.

[18] S. Dawson-Haggerty, X. Jiang, G. Tolle, J. Ortiz, and D. Culler, "sMAP: A simple measurement and actuation profile for physical information," in Proc. ACM Conference on Embedded Networked Sensor Systems (SenSys), Zurich, Switzerland, November 2010, pp. 197-210.

In an embodiment, bandwidth saving during compressed batch transmission over actual network is obtained by measuring size of the link layer packet sent over HTTP from the client (meter) to the server (cloud). It is evaluated over a period of one month and then averaged out to get the per day traffic volume generated due to this data communication.

TABLE 2

| nRMSE comparison for different venues and different variables | | | | | | | | |
|---|---|---|---|---|---|---|---|---|
| | | AP | Current | Energy | Freq | Power | PF | Voltage |
| IITD-01 | AMDC | 0.0034 | 0.0044 | 0.0001 | 0.0002 | 0.0032 | 0.0117 | 0.0005 |
| | ACS | 0.00001 | 0.00001 | 0.00003 | 0.0001 | 0.00001 | 4.60E−16 | 0.0001 |
| IITD-02 | AMDC | 0.005 | 0.0043 | 0.0004 | 0.0014 | 0.0039 | 0.0222 | 0.0036 |
| | ACS | 0.00001 | 0.00001 | 0.00004 | 0.0001 | 0.00001 | 0.0029 | 0.0001 |
| IITD-03 | AMDC | 0.0057 | 0.006 | 0.0005 | 0.0044 | 0.0038 | 0.0029 | 0.0049 |
| | ACS | 0.00004 | 0.00005 | 0.00003 | 0.0001 | 0.00004 | 0.0002 | 0.0001 |
| IITD-04 | AMDC | 0.0064 | 0.0073 | 0.0005 | 0.0005 | 0.0066 | 0.0081 | 0.0076 |
| | ACS | 0.00004 | 0.00002 | 0.00004 | 0.0001 | 0.00004 | 0.0137 | 0.0001 |
| iAWE | AMDC | 0.0077 | 0.0074 | — | 0.0034 | 0.0082 | 0.0055 | 0.0027 |
| | ACS | 0.00003 | 0.00003 | — | 0.00001 | 0.00003 | 0.0004 | 0.00004 |

FIG. 8 illustrates bandwidth saving comparison with ACS in accordance with an embodiment of the present invention. From FIG. 8, it can be observed that considerable amount of gain in bandwidth saving can be achieved through AMDC over ACS while bounding the error induced within allowable threshold for a particular application. It can be seen that AMDC achieves 40% to 65% gain in bandwidth saving over ACS for 30 second sampled data across all venues and 75% gain in case of 1 sec sampled dataset iAWE.

Figure 9:
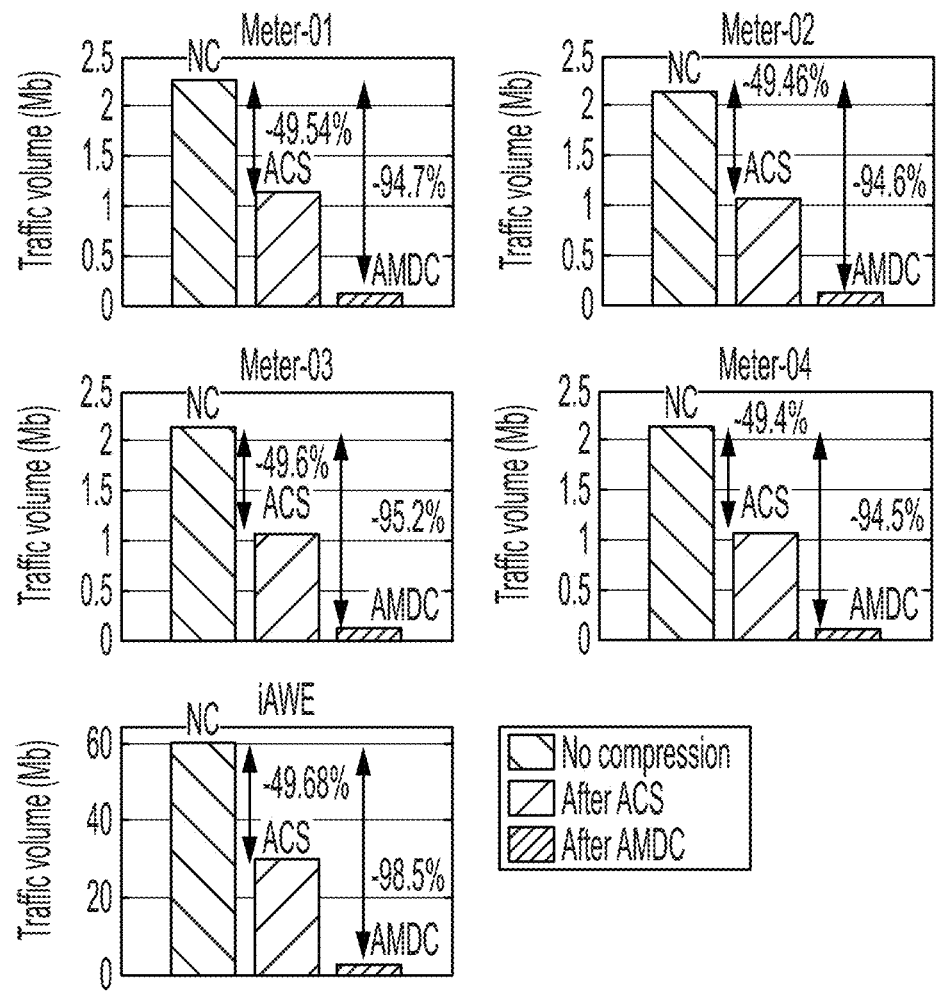
FIG. 9 illustrates comparison in terms of packet traffic volume generated per day in accordance with an embodiment of the present invention.

The AMDC algorithm of the present invention has been implemented in real smart meters. Each of the smart meters was operated on a Raspberry Pi 3 board having a 1.2 GHz 64-bit quad-core ARMv8 processor and 1 GB RAM. It had an ENERSOL MFR28 energy meter which records multiple variables data at a sampling interval of 30 seconds. After recording data for multiple variables, all of them were stacked in JavaScript Object Notation (JSON) format and then zipped to transmit it over TCP/HTTP link to a storage cloud through a TP-LINK TL-MR3020 wireless router. The conventional system does not use any intelligence to decide on which variable or how many samples of each variable are to be sent, it sends all of them instead. It uses sMAP 2.0 [18] as a standard architecture at the heart of this system. sMAP, or the Simple Measurement and Actuation Profile is a specification for a protocol which helps an IoT system to easily read variety of sensor data in a simple and configurable setting. It also enables publishing the corresponding time-series data to the web or a central cloud. Whereas, the proposed AMDC algorithm is configured in the R-Pi processor and operates before data transmission to dynamically choose a subset of the variables using PCA. Subsequently, it compresses each of the selected streams temporally as well using CS. The frequency of reporting compressed data to the cloud is decided based on the optimum batch-size for a The traffic volume generated without any kind of data compression is compared with the same generated after applying ACS and the proposed AMDC algorithm. It can be seen from FIG. 9 that ACS can reduce the traffic by about 50% whereas AMDC can reduce it by about 95% for 30 second sampled data and 98.5% for 1 second sampled iAWE dataset. The difference in percentage savings compared to as shown in FIG. 8 comes due to the fact that, the bandwidth saving shown in FIG. 8 is only dependent on the data whereas the saving shown in FIG. 9 is also impacted by the network overhead.

Hence, the proposed AMDC algorithm can reduce bandwidth requirement of multivariate smart meter data over actual transmission network up to 98.5% with faithful reconstruction of data in the aggregator within the error bound of an acceptable threshold. Variable patterns in different data are expected to affect the performance of the proposed algorithm as well as the optimum batch size on which it operates.

Figure 10:
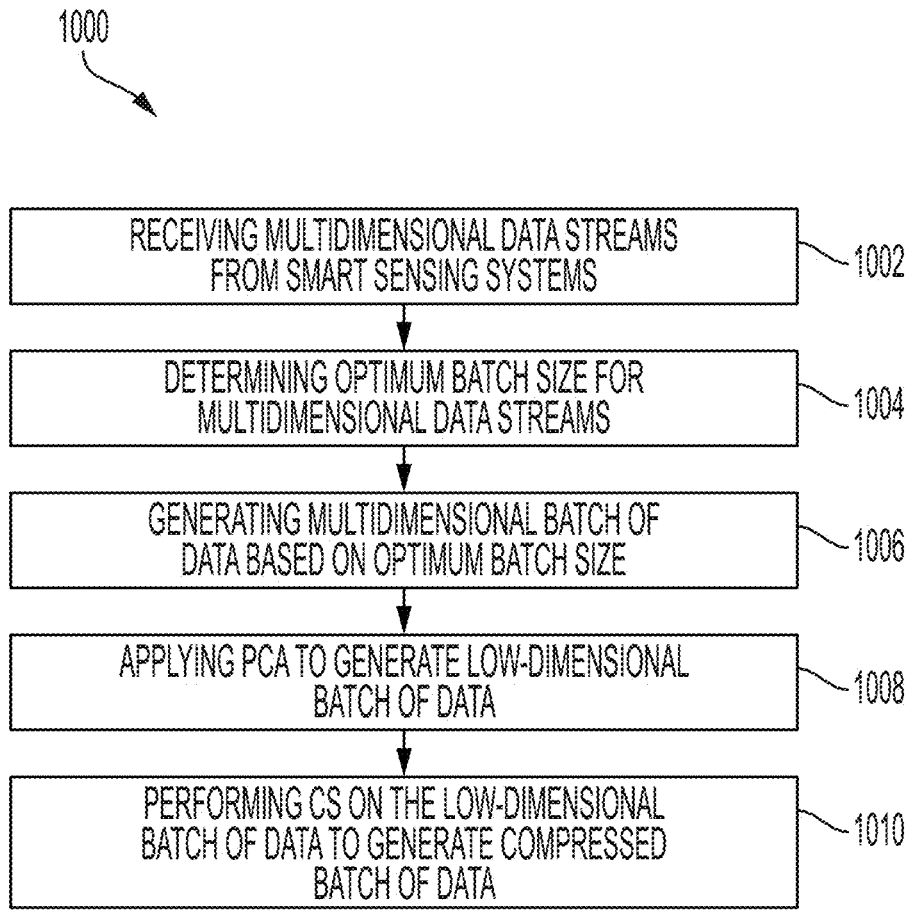
FIG. 10 is a flowchart illustrating a method of compressing data in accordance with an embodiment of the present invention.

FIG. 10 is a flowchart (1000) illustrating a method of compressing data in accordance with an embodiment of the present invention.

At step 1002, the processing unit (104) receives the multidimensional data stream from the smart meter (102).

At step 1004, the processing unit (104) determines an optimum batch size for the data stream.

At 1006, the processing unit (104) generates a multidimensional batch of data based on the optimum batch size.

At step 1008, the processing unit (104) reduces dimensionality of the multidimensional batch of data using PCA to generate a low-dimensional batch of data.

At step 1010, the processing unit (104) performing temporal compression on the low-dimensional batch of data to generate a compressed batch of data.

The foregoing description of the invention has been set merely to illustrate the invention and is not intended to be limiting. Since modifications of the disclosed embodiments incorporating the spirit and substance of the invention may occur to person skilled in the art, the invention should be construed to include everything within the scope of the disclosure.

The invention claimed is:

1. A method of compressing multivariate data, the method comprising:
   receiving a plurality of multidimensional data streams generated by a plurality of smart meters, wherein the plurality of smart meters comprises a processor, a memory, and a communication unit;
   determining an optimum batch size for the multidimensional data streams;
   generating a multidimensional batch of data based on aforesaid batch size;
   reducing dimensionality of the multidimensional batch of data using principal component analysis to generate a low-dimensional batch of data; and
   performing temporal compression on the low-dimensional batch of data to generate a compressed batch of data,
   wherein the optimum batch size is determined such that a normalized root mean square error of output data reconstructed based on the compressed batch of data is less than a predefined error limit.

2. The method as claimed in claim 1, further comprising:
   identifying the principal components in the multidimensional batch of data;
   determining a first set of principal components comprising more variance than a predefined threshold variance; and
   generating the low-dimensional batch of data including the first set of principal components.

3. The method as claimed in claim 1, wherein the optimum batch size is determined based on a sparsity of the multidimensional data streams.

4. A smart sensing architecture, comprising:
   a plurality of smart meters for generating and transmitting a plurality of multidimensional data streams; and
   a processing unit connected to the plurality of smart sensing devices, said processing unit configured to:
      receive the plurality of multidimensional data streams generated by the plurality of smart meters, wherein the plurality of smart meters comprises a processor, a memory, and a communication unit;
      determine an optimum batch size for the multidimensional data streams,
      generate a multidimensional batch of data based on aforesaid batch size,
      reduce dimensionality of the multidimensional batch of data using principal component analysis to generate a low-dimensional batch of data, and
      perform temporal compression on the low dimensional batch of data to generate a compressed batch of data,
      wherein the optimum batch size is determined such that a normalized root mean square error of output data reconstructed based on the compressed batch of data is less than a predefined error limit.

5. The smart sensing architecture as claimed in claim 4, wherein the processing unit is further configured to:
   identify a number of principal components in the multidimensional batch of data,
   determine a first set of principal components comprising more variance than a predefined threshold variance, and
   generate the low-dimensional batch of data including the first set of principal components.

6. The smart sensing architecture as claimed in claim 4, wherein the optimum batch size is determined based on a sparsity of the multidimensional data streams.

* * * * *